United States Patent [19]

Urano et al.

[11] Patent Number: 5,498,641

[45] Date of Patent: Mar. 12, 1996

[54] POLYMERIZABLE COMPOSITION CONTAINING PYRROMETHENE TYPE COLORING MATTER AND TITANOCENE COMPOUND

[75] Inventors: Toshiyuki Urano, Chiba; Hideki Nagasaka, Yamato; Masaaki Tsuchiyama, Machida; Hiroshi Ide, Sagamihara, all of Japan

[73] Assignee: Mitsubishi Chemical Corporation, Tokyo, Japan

[21] Appl. No.: 224,879

[22] Filed: Apr. 8, 1994

[30] Foreign Application Priority Data

Apr. 9, 1993 [JP] Japan .................................. 5-083587
Feb. 4, 1994 [JP] Japan .................................. 6-012949
Feb. 16, 1994 [JP] Japan .................................. 6-019240

[51] Int. Cl.$^6$ ............................ C08F 2/50; C08F 4/14; C08F 4/649
[52] U.S. Cl. .................. 522/26; 522/29; 522/182; 522/184; 522/121
[58] Field of Search ................ 522/26, 29, 182, 522/184, 121

[56] References Cited

U.S. PATENT DOCUMENTS

| | | | |
|---|---|---|---|
| 4,774,339 | 9/1988 | Haugland et al. | 548/405 |
| 5,011,755 | 4/1991 | Rodhe et al. | 522/26 |
| 5,187,288 | 2/1993 | Kang et al. | 548/110 |

FOREIGN PATENT DOCUMENTS 0277915  8/1988  European Pat. Off. .

Primary Examiner—Susan W. Berman
Attorney, Agent, or Firm—Oblon, Spivak, McClelland, Maier, & Neustadt

[57] ABSTRACT

A photopolymerizable composition comprising at least an addition polymerizable compound having at least one ethylenically unsaturated double bond and a photopolymerization initiator system, which system comprises (a) a sensitizer of the formula (I):

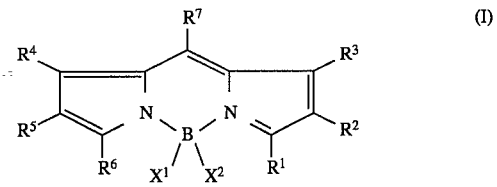

wherein each of $R^1$ to $R^6$ is hydrogen, halogen, alkyl, aryl, aralkyl, acyl, alkoxycarbonyl, optionally substituted hydrocarbon ring, optionally substituted heterocyclic residue or —$SO_3$—$R^8$, wherein $R^8$ is hydrogen, alkyl, aryl, aralkyl, alkali metal, or quaternary ammonium, $R^7$ is hydrogen, alkyl, aryl, aralkyl, optionally substituted hydrocarbon ring, or optionally substituted heterocyclic group, each of $X^1$ and $X^2$ is halogen, alkyl, aryl, aralkyl, optionally substituted hydrocarbon ring, or optionally substituted heterocyclic group, and (b) a titanocene compound.

12 Claims, No Drawings

POLYMERIZABLE COMPOSITION CONTAINING PYRROMETHENE TYPE COLORING MATTER AND TITANOCENE COMPOUND

The present invention relates to a photopolymerizable composition. Particularly, it relates to a photopolymerizable composition showing a very high sensitivity to light rays in the visible light range and having an excellent visible image developing property.

Heretofore, a number of image forming methods have been known in which a photopolymerizing system is utilized. For example, there are a method wherein a photopolymerizable composition comprising an addition polymerizable compound containing an ethylenic double bond and a photopolymerization initiator, and optionally as an additional component an organic polymer binder, is prepared, this photopolymerizable composition is coated on a substrate to obtain a photosensitive material provided with a layer of the photopolymerizable composition, exposure of a desired image is conducted so that the exposed portion is polymerized and cured, and the unexposed portion is then dissolved and removed to form a cured relief image; a method wherein a layer of a photopolymerizable composition is formed between a pair of substrates, at least one of which is transparent, exposure is conducted from the transparent substrate side so that a change in the bonding strength is created by the radiation, and then the substrate is peeled off to form an image; and a method wherein an image is formed by utilizing a change in the adhesion of a toner caused by radiation to a layer of a photopolymerizable composition. As the photopolymerization initiator of the photopolymerizable composition used in these methods, benzoin, benzoin alkyl ether, benzil ketal, benzophenone, anthraquinone, benzil or Michler's ketone has been employed. These photopolymerization initiators have an ability to initiate photopolymerization with light rays of short wavelength in the ultraviolet light range of at most 400 nm. However, their photopolymerization initiating ability with light rays in the visible light range of at least 400 nm is very low, which has limited the applicable range of the photopolymerizable compositions containing them.

In recent years, with the progress of image-forming techniques, there has been a strong demand for photopolymers highly sensitive to light rays in the visible light range. For example, they are photosensitive materials suitable for non-contact type projection exposure plate making or laser plate making by a visible ray laser. Among such techniques, a plate making system employing an oscillation beam of visible light rays by an argon ion laser or a YAG laser is considered to be one of the most prospective techniques. Heretofore, some proposals have been made with respect to photopolymerizable compositions containing a photopolymerization initiator system sensitive to light rays in the visible light range. For example, there may be mentioned a system comprising a hexarylbiimidazole, a radical-forming agent and a dye (Japanese Examined Patent Publication No. 37377/1970), a system comprising a hexarylbiimidazole and a (p-dialkylaminobenzylidene) ketone (Japanese Unexamined Patent Publications No. 2528/1972 and No. 155292/1979), a system comprising a cyclic cis-α-dicarbonyl compound and a dye (Japanese Unexamined Patent Publication No. 84183/1973), a system comprising a substituted triazine and a merocyanine dye (Japanese Unexamined Patent Publication No. 151024/1979), a system comprising a ketocumarine and an active agent (Japanese Unexamined Patent Publications No. 112681/1977, No. 15503/1983 and No. 88005/1985), a system comprising a substituted triazine and a sensitizer (Japanese Unexamined Patent Publications No. 29803/1983 and No. 40302/1983), a system comprising biimidazole, a styrene derivative and thiol (Japanese Unexamined Patent Publication No. 56403/1984), a system comprising an organic peroxide and a dye (Japanese Unexamined Patent Publications No. 140203/1984 and No. 189340/1984), cases wherein a titanocene is used for a photopolymerization initiating system (Japanese Unexamined Patent Publications No. 152396/1984, No. 151197/1986, No. 10602/1988, No. 41484/1988, No. 291/1990, No. 12403/1991, No. 20293/1991, No. 27393/1991, and No. 52050/1991), and a system wherein a titanocene, a xanthane dye and an addition polymerizable ethylenically unsaturated double bond-containing compound having an amino group or a urethane group, are combined (Japanese Unexamined Patent Publications No. 221958/1992 and No. 219756/1992). These conventional techniques are certainly effective for visible light rays. However, they have a drawback that the sensitivity is not so high, and they are inadequate from the practical viewpoint.

Further, the system comprising a titanocene and a 3-ketocumarine dye as disclosed in Japanese Unexamined Patent Publication No. 221110/1988 is excellent in the sensitivity to light of about 488 nm of an argon ion laser, but the photosensitive layer shows no strong absorption in the visible light range and thus has a problem that it is inferior in the visiblity of the image portion after development (i.e. the visiblity of the developed image), particularly in the visiblity of the developed image under a yellow light working condition. If a pigment or dye showing strong absorption of such visible light rays is added to this system to improve the visiblity of the developed image, a substantial decrease in the sensitivity (quenching) is likely to result.

The present inventors have conducted extensive studies to solve such problems and to provide an excellent photopolymerizable composition and as a result have found that high sensitivity and practical usefulness can be secured with a photopolymerizable composition comprising at least an addition polymerization compound and a photopolymerization initiator system wherein the addition polymerizable compound has at least one ethylenically unsaturated double bond, when the photopolymerization initiator system contains a sensitizer having a certain specific backbone structure and at least one titanocene compound capable of generating active radicals when irradiated in the presence of the sensitizer. The present invention has been accomplished on the basis of this discovery.

Namely, it is an object of the present invention to provide a photopolymerizable composition having high sensitivity to light rays of long wavelengths such as visible light rays.

Another object of the present invention is to provide a photopolymerizable composition excellent in the visiblity of the developed image.

A further object of the present invention is to provide a photopolymerizable composition excellent in the stability with time.

Still another object of the present invention is to provide a photopolymerizable composition which makes a high speed plate making operation possible by means of a low output laser such as an air-cooling argon laser or a YAG laser, for example, in the case of a laser plate making by means of e.g. an argon ion laser.

A further object of the present invention is to provide a photopolymerizable composition which makes the plate making operation very advantageous from the viewpoint of cost and time.

Such objects of the present invention can readily be accomplished by a photopolymerizable composition comprising at least an addition polymerizable compound and a photopolymerization initiator system, wherein the addition polymerizable compound has at least one ethylenically unsaturated double bond, and the photopolymerization initiator system comprises:

(a) a sensitizer of the following formula (I):

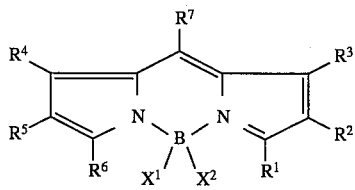

wherein each of $R^1$ to $R^6$ is a hydrogen atom, a halogen atom, an alkyl group, an aryl group, an aralkyl group, an acyl group, an alkoxycarbonyl group, a substituted or unsubstituted hydrocarbon ring residue, a substituted or unsubstituted heterocyclic residue, or $-SO_3-R^8$, wherein $R^8$ is a hydrogen atom, an alkyl group, an aryl group, an aralkyl group, an alkali metal atom or a quaternary ammonium group, $R^7$ is a hydrogen atom, an alkyl group, an aryl group, an aralkyl group, a substituted or unsubstituted hydrocarbon ring residue, or a substituted or unsubstituted heterocyclic residue, each of $X^1$ and $X^2$ is a halogen atom, an alkyl group, an aryl group, an aralkyl group, a substituted or unsubstituted hydrocarbon ring residue, or a substituted or unsubstituted heterocyclic group, and (b) a titanocene compound capable of generating radicals when irradiated in the presence of the sensitizer.

Now, the present invention will be described in detail with reference to the preferred embodiments.

The addition polymerizable compound having at least one ethylenically unsaturated double bond (hereinafter referred to simply as "ethylenic compound") contained as a first essential component in the photopolymerizable composition of the present invention is a compound having an ethylenically unsaturated double bond, which is capable of undergoing addition polymerization and being cured by the action of the photopolymerization initiator system as a second essential component, when the photopolymerizable composition is irradiated with active light rays. For example, it may be a monomer having such a double bond or a polymer having an ethylenically unsaturated double bond in its side chain or main chain. In the present invention, the monomer is meant for a substance as opposed to a so-called polymer substance and includes dimers, trimers and oligomers in addition to monomers in a narrow sense.

The monomer having an ethylenically unsaturated double bond includes, for example, an unsaturated carboxylic acid, an ester of an unsaturated carboxylic acid with an aliphatic polyhydroxy compound, an ester of an unsaturated carboxylic acid with an aromatic polyhydroxy compound and an ester obtained by the esterification reaction of an unsaturated carboxylic acid and a polybasic carboxylic acid with a polyhydroxy compound such as the above-mentioned aliphatic polyhydroxy compound or aromatic polyhydroxy compound.

The above-mentioned ester of an unsaturated carboxylic acid with an aliphatic polyhydroxy compound is not particularly limited and includes, as specific examples, acrylic acid esters such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetracrylate, dipentaerythritol tetracrylate, dipentaerythritol pentacrylate, dipentaerythritol hexacrylate and glycerol acrylate; methacrylic acid esters corresponding to the above examples wherein "acrylate" is changed to "methacrylate"; itaconic acid esters corresponding to the above examples wherein "acrylate" is likewise changed to "itaconate"; crotonic acid esters corresponding to the above examples wherein "acrylate" is likewise changed to "crotonate"; and maleic acid esters corresponding to the above examples wherein "acrylate" is likewise changed to "maleate".

The ester of an unsaturated carboxylic acid with an aromatic polyhydroxy compound includes, for example, hydroquinone diacrylate, hydroquinone dimethacrylate, resorcinol diacrylate, resorcinol dimethacrylate and pyrogallol triacrylate.

The ester obtained by the esterification reaction of an unsaturated carboxylic acid and a polybasic carboxylic acid with a polyhydroxy compound may not necessarily be a single compound. Typical specific examples include a condensation product of acrylic acid, phthalic acid and ethylene glycol, a condensation product of acrylic acid, maleic acid and diethylene glycol, a condensation product of methacrylic acid, terephthalic acid and pentaerythritol and a condensation product of acrylic acid, adipic acid, butane diol and glycerol.

Other ethylenic compounds which may be used in the present invention include, for example, acrylamides such as ethylene bisacrylamide; allyl esters such as diallyl phthalate; and vinyl group-containing compounds such as divinyl phthalate.

The polymer having an ethylenically unsaturated double bond on the main chain includes, for example, a polyester obtained by the polycondensation reaction of an unsaturated dibasic carboxylic acid with a dihydroxy compound, and a polyamide obtained by the polycondensation reaction of an unsaturated dibasic carboxylic acid with a diamine. The polymer having an ethylenically unsaturated double bond at the side chain may be a condensation polymer of a dibasic carboxylic acid having an unsaturated bond at the side chain such as itaconic acid, propylidenesuccinic acid or ethylidenemalonic acid with a dihydroxy or diamine compound. Further, a polymer having a functional group having a reactivity such as a hydroxyl group or a halogenated methyl group in the side chain, such as a polymer obtained by a polymer reaction of e.g. polyvinyl alcohol, poly(2-hydroxyethyl methacrylate) or polyepichlorohydrin with an unsaturated carboxylic acid such as acrylic acid, methacrylic acid or crotonic acid, may also be suitable for use.

Among the above-mentioned ethylenic compounds, monomers of acrylic acid esters or methacrylic acid esters are particularly suitable for use.

Now, the photopolymerization initiator system as a second essential component of the photopolymerizable composition of the present invention will be described.

The photopolymerization initiator system of the present invention is a combination of at least two components. The first component is a sensitizer of the above-mentioned formula (I) represented by (a) in the present invention, wherein each of $R^1$ to $R^6$ is a hydrogen atom, a halogen atom, an alkyl group, an aryl group, an aralkyl group, an acyl group, an alkoxycarbonyl group, a substituted or unsubstituted hydrocarbon ring, a substituted or unsubstituted heterocyclic group, or $-SO_3-R^8$ wherein $R^8$ is a hydrogen atom, an alkyl group, an aryl group, an aralkyl group, an alkali metal atom or a quaternary ammonium group, $R^7$ is a hydrogen atom, an alkyl group, an aryl group, an aralkyl group, a substituted or unsubstituted hydrocarbon ring, or a substituted or unsubstituted heterocyclic group, each of $X^1$ and $X^2$ is a halogen atom, an alkyl group, an aryl group, an aralkyl group, a substituted or unsubstituted hydrocarbon ring, or a substituted or unsubstituted heterocyclic group.

Such a sensitizer is not particularly limited and may, for example, be prepared by a method disclosed in U.S. Pat. No. 4,774,339, J. H. Boyer et al., Heteroatom Chemistry, Vol. 1, 5, 389 (1990).

The alkyl group for each of $R^1$ to $R^6$ and $R^8$ preferably has from 1 to 6 carbon atoms, more preferably from 1 to 3 carbon atoms, and it may be a straight chain or may have a side chain. The acyl group and the alkoxycarbonyl group for any of $R^1$ to $R^6$ preferably has from 1 to 3 carbon atoms in its carbon chain. The aralkyl group and the aryl group for any of $R^1$ to $R^6$ and $R^8$ preferably has from 4 to 10 carbon atoms. The halogen atom for any of $R^1$ to $R^6$ is usually preferably a bromine atom or a chlorine atom. The alkali metal atom for $R^8$ is usually preferably a lithium atom, a sodium atom or a potassium atom. The hydrocarbon ring for any of $R^1$ to $R^6$, $X^1$ and $X^2$ is preferably monocyclic or bicyclic, and its substituent is particularly preferably a $C_{1-3}$ alkyl group. The heteroatom contained in the heterocyclic residue is usually preferably a nitrogen atom, an oxygen atom or a sulfur atom. $R^7$ is preferably a $C_{3-20}$ alkyl group from the viewpoint of the solubility in coated layer or stability with time.

Now, typical examples of the sensitizer of the formula (I) will be given. However, the sensitizer of the formula (I) useful for the present invention is not limited to such specific examples.

In the following examples, each of $R^1$, $R^3$, $R^4$ and $R^6$ is a methyl group, and each of $X^1$ and $X^2$ is a fluorine atom, unless otherwise specified.

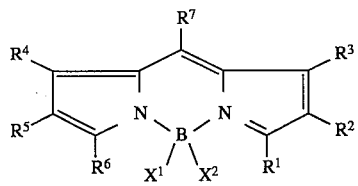
(I)

a-(I-1) $R^2$ and $R^5$: hydrogen atom, $R^7$: hydrogen atom
a-(I-2) $R^2$ and $R^5$: hydrogen atom, $R^7$: methyl group
a-(I-3) $R^2$ and $R^5$: hydrogen atom, $R^7$: ethyl group
a-(I-4) $R^2$ and $R^5$: hydrogen atom, $R^7$: n-pentyl group
a-(II-1) $R^2$ and $R^5$: methyl group, $R^7$: hydrogen atom
a-(II-2) $R^2$ and $R^5$: methyl group, $R^7$: methyl group
a-(II-3) $R^2$ and $R^5$: methyl group, $R^7$: ethyl group
a-(II-4) $R^2$ and $R^5$: methyl group, $R^7$: n-pentyl group
a-(III-5) $R^2$ and $R^5$: methyl group, $R^7$: n-hexyl group
a-(III-1) $R^2$ and $R^5$: ethyl group, $R^7$: hydrogen atom
a-(III-2) $R^2$ and $R^5$: ethyl group, $R^7$: methyl group
a-(III-3) $R^2$ and $R^5$: ethyl group, $R^7$: ethyl group
a-(III-4) $R^2$ and $R^5$: ethyl group, $R^7$: n-butyl group
a-(III-5) $R^2$ and $R^5$: ethyl group, $R^7$: n-pentyl group
a-(III-6) $R^2$ and $R^5$: ethyl group, $R^7$: n-hexyl group
a-(III-7) $R^2$ and $R^5$: ethyl group, $R^7$: n-heptyl group
a-(III-8) $R^2$ and $R^5$: ethyl group, $R^7$: 2-ethylpentyl group
a-(III-9) $R^2$ and $R^5$: ethyl group, $R^7$: iso-propyl group
a-(III-10) $R^2$ and $R^5$: ethyl group, $R^7$: n-decyl group
a-(III-11) $R^2$ and $R^5$: ethyl group, $R^7$: n-lauryl group
a-(IV-1) $R^2$ and $R^5$: ethoxycarbonyl group, $R^7$: hydrogen atom
a-(IV-2) $R^2$ and $R^5$: ethoxycarbonyl group, $R^7$: methyl group
a-(IV-3) $R^2$ and $R^5$: ethoxycarbonyl group, $R^7$: n-butyl group
a-(V-1) $R^2$ and $R^5$: hydrogen atom, $R^7$: hydrogen atom, $X^1$ and $X^2$: ethyl group a-(V-2) $R^2$ and $R^5$: methyl group, $R^7$: hydrogen atom, $X^1$ and $X^2$: ethyl group
a-(V-3) $R^2$ and $R^5$: sulphonylethyl group, $R^7$: n-pentyl group
a-(VI-1) $R^2$: $SO_3-CH_2PhCO_2C_2H_5$, $R^5$: $SO_3^- \cdot Na^+$
a-(VI-2) $R^2$ and $R^5$: $SO_3^- \cdot N^+(C_2H_5)_3(CH_2ph)$
a-(VI-3) $R^2$ and $R^5$: $SO_3^- \cdot I^+Ph_2$ In the above formulas, Ph is a phenyl group.

In the present invention, at least one of the sensitizers as mentioned above is selected for use.

The second component constituting the photopolymerization initiator system of the present invention is a titanocene compound capable of generating active radicals when irradiated in the presence of the above-described sensitizer, which is represented by (b) in the present invention. The titanocene compound is not particularly limited and may, for example, be suitably selected for use from various titanocene compounds disclosed in Japanese Unexamined Patent Publications No. 152396/1984 and No. 151197/1986. More specifically, it includes, for example, di-cyclopentadienyl-Ti-di-chloride, di-cyclopentadienyl-Ti-bis-phenyl, di-cyclopentadienyl-Ti-bis-2,3,4,5,6-pentafluorophenyl-1-yl (hereinafter referred to as b-1), di-cyclopentadienyl-Ti-bis-2,3,5,6-tetrafluorophen-1-yl, di-cyclopentadienyl-Ti-bis-2,4,6-trifluorophen-1-yl, di-cylcopentadienyl-Ti-bis-2,6-di-fluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,6-difluorophen-1-yl, and di-cyclopentadienyl-Ti-bis-2,6-difluoro-3-(pyrr-1-yl)-phen-1-yl (hereinafter referred to as b-2).

More preferably, the initiator system contains at least one member selected from the group consisting of dialkylamino compounds of the following formulas:

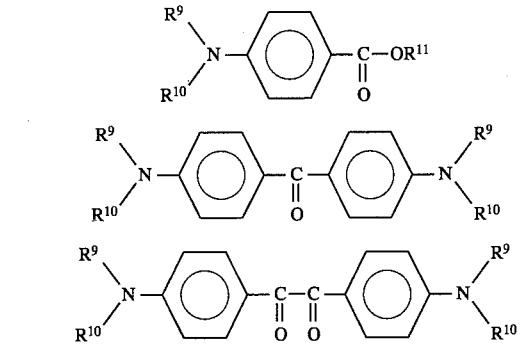

wherein each of $R^9$ and $R^{10}$ is a $C_{1-4}$ alkyl group, and $R^{11}$ is a $C_{1-20}$ alkyl group, Specific preferred examples include a dialkylaminobenzoic acid alkyl ester such as p-dimethylaminobenzoic acid ethyl ester (hereinafter referred to simply as c-1), p-diethylaminobenzoic acid ethyl ester, p-dimethylaminobenzoic acid isopropyl ester (hereinafter referred to simply as c-2), p-dimethylaminobenzoic acid n-butyl ester, p-dimethylaminobenzoic acid n-octyl ester or p-di-n-butylaminobenzoic acid ethyl ester; a bisaminobenzophenone such as 4,4'-bis(dimethylamino)benzophenone (hereinafter referred to simply as c-3), 4,4'-bis(diethylamino)benzophenone or 4,4'-bis(diisopropylamino)benzophenone; and a bisaminobenzil such as 4,4'-bis(dimethylamino)benzil (hereinafter referred to simply as c-4) or 4,4'-bis(dimethylamino)benzil. Among them, a dialkylaminobenzoic acid alkyl ester is particularly preferred.

Suitable amounts of the sensitizer and the titanocene compound constituting the photopolymerization initiator system to be used for the photopolymerizable composition of the present invention as described above, are not particularly limited. However, the sensitizer is preferably from 0.05 to 20 parts by weight, more preferably from 0.2 to 10 parts by weight, and the titanocene compound is preferably from 0.5 to 20 parts by weight, more preferably from 0.5 to 10 parts by weight, per 100 parts by weight of the ethylenic compound. Further, the dialkylamino compound which is used as the case requires, is preferably from 0.1 to 40 parts by weight, more preferably from 0.5 to 20 parts by weight.

The photopolymerizable composition of the present invention may preferably contain, in addition to the above described respective constituting components, an organic polymer material as a binder to modify the composition or to improve the physical properties after the photocuring. The binder may suitably be selected depending upon the particular purpose for improvement, such as compatibility, film-forming ability, developing property or adhesive property. Specifically, for the purpose of improving the aqueous developing property, an acrylic acid copolymer, a methacrylic acid copolymer, an itaconic acid copolymer, a partially esterified maleic acid copolymer, an acidic cellulose modified product having a carboxyl group in its side chain, a polyethylene oxide or a polyvinyl pyrrolidone may, for example, be mentioned. For the purpose of improving the film strength and adhesive property, a polyether of epichlorohydrin with bisphenol A; a soluble nylon; a polyalkyl methacrylate such as polymethyl methacrylate or a polyalkyl acrylate; a copolymer of an alkyl methacrylic acid with acrylonitrile, acrylic acid, methacrylic acid, vinyl chloride, vinylidene chloride or styrene; a copolymer of acrylonitrile with vinyl chloride or vinylidene chloride; a copolymer of vinylidene chloride, chlorinated polyolefin, vinyl chloride and vinyl acetate; polyvinyl acetate; a copolymer of acrylonitrile with styrene; a copolymer of acrylonitrile with butadiene or styrene; a polyvinylalkyl ether; a polyvinylalkyl ketone; a polystyrene; a polyamide; a polyurethane; a polyethylene terephthalate isophthalate; acetyl cellulose, or polyvinyl butyral may, for example, be mentioned.

Such a binder may be incorporated in a weight ratio within a range of preferably at most 500%, more preferably at most 200%, relative to the ethylenic compound.

The photopolymerizable composition of the present invention may further contain a thermal polymerization inhibitor, a coloring agent, a plasticizer, a surface-protective agent, a smoothing agent, a coating assistant and other additives, as the case requires.

The thermal polymerization inhibitor may, for example, be hydroquinone, p-methoxyphenol, pyrogallol, catechol, 2,6-di-t-butyl-p-cresol or β-naphtol. The coloring agent may, for example, be a pigment such as a phthalocyanin-type pigment, an azo-type pigment, carbon black or titanium oxide, ethyl violet, crystal violet, an azo-type dye, an anthraquinone-type dye or a cyanin-type dye. The amounts of the thermal polymerization inhibitor and the coloring agent, when the above-described binder is used, are such that the thermal polymerization inhibitor is from 0.01 to 3% by weight, and the coloring agent is from 0.1 to 20% by weight, based on the total weight of the ethylenic compound and the binder.

The plasticizer may, for example, be dioctyl phthalate, didodecyl phthalate, triethylene glycol dicaprilate, dimethyl glycol phthalate, tricredyl phosphate, dioctyl adipate, dibutyl cebacate or triacetyl glycerol. When the binder is used, such a plasticizer may be added in an amount of at most 10% by weight based on the total weight of the ethylenic compound and the binder.

When the photopolymerizable composition of the present invention is to be used, it may be formed into a photosensitive material without using any solvent, or it may be solved in a suitable solvent to form a solution, which is then coated and dried on a substrate to obtain a photosensitive material. The solvent may, for example, be methyl ethyl ketone, cyclohexanone, butyl acetate, amyl acetate, ethyl propionate, toluene, xylene, monochlorobenzene, carbon tetrachloride, trichloroethylene, trichloroethane, dimethylformamide, methyl cellosolve, ethyl cellosolve, tetrahydrofuran or benzoquinone. These solvents may be used alone or in combination as a mixture of two or more of them.

The substrate to be used for preparing a photosensitive material using the photopolymerizable composition of the present invention may be any substrate which is commonly used for this purpose. For example, it may be a sheet of a metal such as aluminum, magnesium, copper, zinc, chromium, nickel or iron or an alloy containing such a metal as the main component; a paper material such as high quality paper, art paper or release paper; an inorganic sheet such as a glass sheet or a ceramics sheet; or a polymer sheet of e.g. polyethylene terephthalate, polyethylene, polymethyl methacrylate, polyvinyl chloride, a vinyl chloride-vinylidene chloride copolymer, polystyrene, 6-nylon, cellulose triacetate or cellulose acetate butyrate.

Further, a conventional technique to prevent adverse effects of oxygen such as deterioration of the sensitivity or deterioration of the storage stability, may be applied to the photopolymerizable composition of the present invention. For example, a transparent cover sheet which is releasable may be provided on the photosensitive layer, or a coating layer of e.g. a wax-like substance having low oxygen permeability or a water-soluble polymer, may be formed on the photosensitive layer.

There is no particular restriction as to the light source for radiation applicable to the composition of the present invention. A commonly employed light source containing visual light rays of at least 400 nm may suitably be used, such as a carbon arc, a high pressure mercury lamp, a xenon lamp, a metal halide lamp, a fluorescent lamp, a tungsten lamp, a helium-cadmium laser, an argon ion laser or a TAG laser.

Now, the present invention will be described in further detail with reference to Examples and Comparative Examples. However, it should be understood that the present invention is by no means restricted by these specific Examples.

EXAMPLES 1 TO 6 AND COMPARATIVE EXAMPLES 1 AND 2

A coating solution of the photopolymerizable composition as identified in Table 2 was whirl-coated on a grained and anodized aluminum sheet so that the dried film thickness would be 2 μm, and on its surface, an aqueous polyvinyl alcohol solution was coated so that the dried film thickness would be 3 μm, whereby a photosensitive test sample was obtained.

Then, this photosensitive test sample was exposed for 10 seconds by a spectral sensitivity measuring apparatus manufactured by Narumi K. K. using a xenon lamp UI-501C manufactured Ushio Denki K. K. so that the light intensity weakened logarithmically with the abscissa representing a wavelength and the ordinate representing the light intensity. The exposed test sample was developed by an aqueous solution containing 2 wt % of butyl cellosolve and 1 wt % of sodium silicate. From the height of the obtained cured image, the minimum dose required for the formation of the photocured image was calculated and represented as the sensitivity of the photosensitive composition. Further, the visiblity of the developed image was visually evaluated under a yellow light which is commonly used. The results are shown in Table 1.

TABLE 1

|  | Sensitizer sample (amount) | Titanocene compound sample (amont) | Sensitivty Dose mJcm$^{-2}$ (wavelength nm) | Visiblity of the developed iamge |
|---|---|---|---|---|
| Example 1 | a-(I-1) (2 parts) | b-1 (1 part) | 1.5 (490) | A |
| Example 2 | a-(I-2) (2 parts) | b-1 (1 part) | 1.2 (490) | A |
| Example 3 | a-(II-1) (2 parts) | b-1 (1 part) | 1.2 (490) | A |
| Example 4 | a-(II-2) (2 parts) | b-1 (1 part) | 1.0 (490) | A |
| Example 5 | a-(III-1) (2 parts) | b-1 (1 part) | 0.5 (530) | A |
| Example 6 | a-(III-2) (2 parts) | b-1 (1 part) | 0.4 (530) | A |
| Comparative Example 1 | S-1 (2 parts) | b-1 (1 part) | No image formed | — |
| Comparative Example 2 | S-2 (2 parts) | b-1 (1 part) | No image formed | — |
| Comparative Example 3 | S-3 (2 parts) | b-1 (1 part) | 4.0 (490) | C |

TABLE 2

| Coating solution of a photosensitive composition | |
|---|---|
| Methyl methacrylate/methacrylic acid copolymer (Weight average molecular weight: 45,000, copolymerization ratio: 85/15) | 50 parts |
| Trimethylol propane triacrylate | 50 parts |
| Methyl cellosolve | 800 parts |
| Tetrahydrofuran | 50 parts |
| Sensitizer | (as disclosed in Table 1) |
| Titanocene compound | (as disclosed in Table 1) |

In Table 1, the visible image developing property was evaluated by the following standards:

A: An orange colored photocured image is clearly observed.

B: An orange colored photocured image is slightly observed.

C: No substantial photocured image is observed.

The sensitizers (S-1), (S-2) and (S-3) are as follows:

Eosin Yellow (S-1)

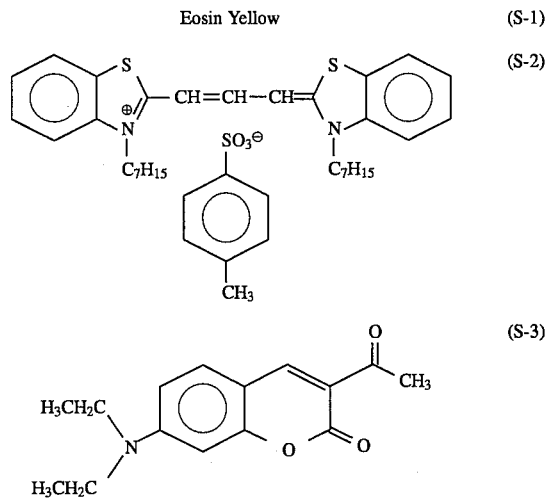

Examples for the preparation of sensitizing dyes

Equimolar amounts of the dye of the following formula (manufactured by Exyton Company) and ethyl p-bromomethylbenzoate were added to a dimethylsulfoxide solvent, and the mixture was stirred at 60° C. for two hours. Then, water was added thereto, and the mixture was left to stand at room temperature overnight, whereupon precipitated crystals were collected by filtration to obtain dye VI-1. This dye was identified and confirmed by the NMR, IR, Mass absorption spectra. Likewise, 2 mols of a quaternary ammonium salt was added to 1 mol of the following dye, and the mixture was added to a dimethylsulfoxide solvent. The mixture was stirred at 50° C. overnight. Then, water was added thereto, and the mixture was left to stand at room temperature for 12 hours, whereupon precipitated crystals were collected by filtration to obtain dye VI-2. Likewise, 2 mols of a diphenyliodonium salt was added to 1 mol of the following dye, and the mixture was added to a dimethylsulfoxide solvent. The mixture was stirred at 50° C. overnight. Then, water was added thereto, and the mixture was left to stand at room temperature for 12 hours, whereupon precipitated crystals were collected by filtration to obtain dye VI-3. These dyes were also identified and confirmed by the NMR, IR and Mass absorption spectra.

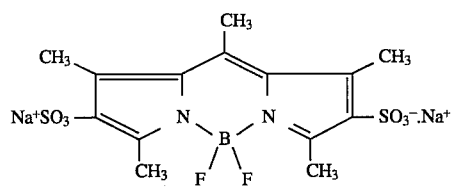

EXAMPLES 7 TO 9

Using the above sensitizing dyes, the sensitivity was measured in the same manner as in Example 1. The photosensitive coating solution used is shown in Table 4, and the results of the measurements are shown in Table 3.

TABLE 3

|  | Sensitizer sample | Titanocene compound sample | Sensitivty Dose mJcm$^{-2}$ (wavelength nm) |
|---|---|---|---|
| Example 7 | a-(VI-1) | b-2 | 0.38 (530) |
| Example 8 | a-(VI-2) | b-2 | 0.61 (488) |
| Example 9 | a-(VI-3) | b-2 | 1.30 (488) |

TABLE 4

| Coating solution of a photosensitive composition | |
|---|---|
| Methyl methacrylate/methacrylic acid/ethyl acrylate copolymer (Weight average molecular weight: 100,000, copolymerization ratio: 80/8/12) | 5 g |
| Trimethylol propane triacrylate | 5 g |
| Polyacrylic acid (Julimer AC-10L, manufactured by Nippon Junyaku K.K.) | 2 g |
| Methyl ethyl ketone | 90 g |
| Sensitizer | 0.2 g (as disclosed in Table 3) |
| Titanocene compound | 0.2 g (as disclosed in Table 3) |
| p-Diethylamino benzoic acid | 0.5 g |

EXAMPLES 10 TO 14

To confirm the effects of the dialkylamino compounds, the sensitivity was measured in the same manner as in Example 7 using the coating solution of the photosensitive composition as identified in Table 6.

TABLE 5

| | Sensitizer sample | Titanocene compound sample | Dialkyl-amino comound | Sensitivty Dose mJcm$^{-2}$ (wavelength nm) |
|---|---|---|---|---|
| Example 10 | a-(III-2) | b-2 | c-1 | 0.10 (530) |
| Example 11 | a-(III-2) | b-2 | c-2 | 0.10 (530) |
| Example 12 | a-(III-2) | b-2 | c-3 | 0.12 (530) |
| Example 13 | a-(III-2) | b-2 | c-4 | 0.15 (530) |
| Example 14 | a-(III-2) | b-2 | Nil | 0.19 (530) |

TABLE 6

| Coating solution of a photosensitive composition | |
|---|---|
| Methyl methacrylate/methacrylic acid copolymer (Weight average molecular weight: 45,000, copolymerization ratio: 85/15) | 2 g |
| Trimethylol propane triacrylate | 2 g |
| Methyl ethyl ketone | 36 g |
| Sensitizer | 80 mg (as disclosed in Table 5) |
| Titanocene compound | 80 mg (as disclosed in Table 5) |
| Dialkylamino compound | 200 mg (as disclosed in Table 5) |

EXAMPLES 15 TO 21

To confirm the storage stability of the photosensitive layer, a coating solution of a photosensitive composition as identified in Table 8 was coated on the aluminum sheet in the same manner as in Example 1. This sample was left to stand at room temperature for 5 months, whereupon no change was observed in the appearance of the photosensitive layer except the sample of Example 21, on which an appreciable color fading based on crystalline separation was observed at 10 days.

TABLE 7

| | Sensitizer sample (amount) | Titanocene compound sample | Stability |
|---|---|---|---|
| Example 15 | a-(III-5) (0.2 g) | b-2 | More than 5 months |
| Example 16 | a-(III-4) (0.4 g) | b-2 | More than 5 months |
| Example 17 | a-(III-5) (0.4 g) | b-2 | More than 5 months |
| Example 18 | a-(III-6) (0.4 g) | b-2 | More than 5 months |
| Example 19 | a-(III- 7 (0.4 g) | b-2 | More than 5 months |
| Example 20 | a-(III-11) (0.4 g) | b-2 | More than 5 months |
| Example 21 | a-(III-2) (0.4 g) | b-2 | 10 days |

TABLE 8

| Coating solution of a photosensitive composition | |
|---|---|
| Methyl methacrylate/methacrylic acid copolymer (Weight average molecular weight: 45,000, copolymerization ratio: 85/15) | 5 g |
| Trimethylol propane triacrylate | 5 g |
| Methyl ethyl ketone | 90 g |
| Sensitizer | — (as disclosed in Table 7) |
| Titanocene compound | 0.2 g (as disclosed in Table 7) |

The photopolymerizable composition of the present invention is highly sensitive to visible light rays, particularly long wavelength light rays and excellent in the visiblity of the developed image. Accordingly, the composition is useful in a wide range of application fields. For example, it is useful for the preparation of a printing plate for e.g. lithography, intaglio printing or relief printing, for a photoresist or a dry film for the preparation of printed circuits or integrated circuits, for the formation of images such as relief images or image reproduction, for photocurable inks, paints, and adhesives. Thus, it is industrially very useful.

We claim:

1. A photopolymerizable composition comprising at least an addition polymerizable compound and a photopolymerization initiator system, wherein the addition polymerizable compound has at least one ethylenically unsaturated double bond, and the photopolymerization initiator system comprises:

(a) a sensitizer of the following formula (I):

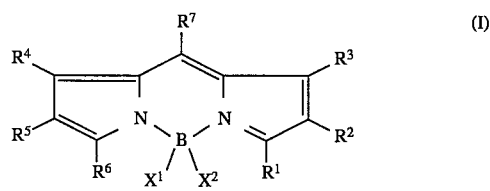

wherein each of $R^1$, $R^3$, $R^4$ and $R^6$ is a hydrogen atom or an alkyl group having from 1 to 6 carbon atoms, each of $R^2$ and $R^5$ is a hydrocarbon atom, an alkyl group having from 1 to 6 carbon atoms, an alkoxycarbonyl group having from 1 to 3 carbon atoms in its carbon chain, —$SO_2C_2H_5$ or —$SO_3$—$R^8$, wherein $R^8$ is —$I^+(Ph)_2$, —$CH_2PhCO_2C_2H_5$, an alkali metal atom or a quaternary ammonium group, wherein Ph is phenyl group, $R^7$ is a hydrogen atom, an alkyl group having from 1 to 20 carbon atoms, and each of $X^1$ and $X^2$ is a halogen atom, and (b) a titanocene compound capable of generating radicals when irradiated in the presence of the sensitizer.

2. The photopolymerizable composition according to claim 1, wherein each of $R^1$ to $R^6$ is a hydrogen atom or an alkyl group having from 1 to 3 carbon atoms, $R^7$ is a hydrogen atom or an alkyl group having from 1 to 20 carbon atoms.

3. The photopolymerizable composition according to claim 1, wherein each of $X^1$ and $X^2$ is a fluorine atom.

4. The photopolymerizable composition according to claim 1, wherein $R^7$ in the formula (I) is a $C_{3-20}$ alkyl group.

5. The photopolymerizable composition according to claim 1, wherein the photopolymerization initiator system further contains at least one member selected from the group consisting of alkylamino compounds of the following formulas:

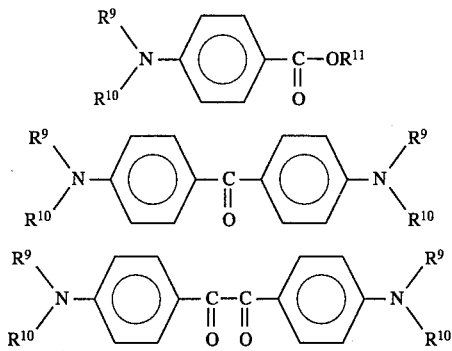

wherein each of $R^9$ and $R^{10}$ is a $C_{1-4}$ alkyl group, and $R^{11}$ is a $C_{1-20}$ alkyl group.

6. The photopolymerizable composition according to claim 5, wherein the photopolymerization initiator system comprises from 0.05 to 20 parts by weight of the sensitizer, from 0.5 to 20 parts by weight of the titanocene compound and from 0.1 to 40 parts by weight of the dialkylamino compound, per 100 parts by weight of the addition polymerizable compound.

7. The photopolymerizable composition according to claim 1, wherein the addition polymerizable compound is a monomer of an acrylic acid ester or a methacrylic acid ester.

8. The photopolymerizable composition according to claim 1, wherein the alkyl group for any of $R^1$ to $R^6$ and $R^8$ has from 1 to 3 carbon atoms.

9. The photopolymerizable composition according to claim 1, wherein the titanocene compound is selected from the group consisting of di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorphen-1-yl, di-cyclopentadienyl-Ti-bis-2,6-di-fluorophen-1-yl, di-cyclopentadienyl-Ti-bis-2,4-di-fluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,6-difluorophen-1-yl and di-cyclopentadienyl-Ti-bis-2,6-difluoro-3-(pyrr-1-yl)-phen-1-yl.

10. The photopolymerizable composition according to claim 1, wherein the photopolymerization initiator system comprises from 0.05 to 20 parts by weight of the sensitizer and from 0.5 to 20 parts by weight of the titanocene compound, per 100 parts by weight of the addition polymerizable compound.

11. The photopolymerizable composition according to claim 1, which contains an organic polymer material as a binder.

12. The photopolymerizable composition according to claim 1, which contains at least one member selected from the group consisting of a thermal polymerization inhibitor, a coloring agent, a plasticizer, a surface-protective agent, a smoothing agent and a coating assistant.

* * * * *